(12) United States Patent
Song

(10) Patent No.: US 12,113,346 B2
(45) Date of Patent: Oct. 8, 2024

(54) CURRENT MEASUREMENT DEVICE

(71) Applicant: LG Energy Solution, Ltd., Seoul (KR)

(72) Inventor: Hyeon-Jin Song, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 96 days.

(21) Appl. No.: 17/798,183

(22) PCT Filed: Jul. 14, 2021

(86) PCT No.: PCT/KR2021/009064
§ 371 (c)(1),
(2) Date: Aug. 8, 2022

(87) PCT Pub. No.: WO2022/019565
PCT Pub. Date: Jan. 27, 2022

(65) Prior Publication Data
US 2023/0070670 A1    Mar. 9, 2023

(30) Foreign Application Priority Data

Jul. 20, 2020 (KR) .......................... 10-2020-0089756

(51) Int. Cl.
*H02H 1/00* (2006.01)
*B60L 58/10* (2019.01)
(Continued)

(52) U.S. Cl.
CPC ........... *H02H 1/0007* (2013.01); *B60L 58/10* (2019.02); *G01R 19/0046* (2013.01);
(Continued)

(58) Field of Classification Search
CPC ........ G01R 1/36; G01R 1/203; G01R 19/046; G01R 19/16542; G01R 27/14;
(Continued)

(56) References Cited

U.S. PATENT DOCUMENTS

2004/0041682 A1\* 3/2004 Pasha ................... H01H 39/006
337/401
2005/0083164 A1    4/2005 Caruso et al.
(Continued)

FOREIGN PATENT DOCUMENTS

CN    205984481 U    2/2017
CN    110797835 A    2/2020
(Continued)

OTHER PUBLICATIONS

Machine translation of Kim et al. Korean Patent Document KR 10-2016-0112417 A Sep. 2016 (Year: 2016).\*
(Continued)

*Primary Examiner* — Kevin J Comber
(74) *Attorney, Agent, or Firm* — Lerner David LLP

(57) ABSTRACT

A current measurement apparatus configured to quickly block current. The current measurement apparatus includes a first terminal, a second terminal, a resistor interposed in a separated space between the first terminal and the second terminal; a circuit board, a control unit mounted on the circuit board and configured to measure a current flowing in the resistor by using a voltage value between the first terminal and the second terminal and a resistance value of the resistor, and a cutting unit located above or below the resistor and configured to cut the resistor according to a control signal of the control unit.

10 Claims, 12 Drawing Sheets

(51) Int. Cl.
  *G01R 19/00* (2006.01)
  *G01R 27/14* (2006.01)
  *G01R 31/374* (2019.01)
  *G01R 31/3835* (2019.01)
  *H01M 10/48* (2006.01)
  *H01M 50/583* (2021.01)
  *H02H 7/18* (2006.01)

(52) U.S. Cl.
  CPC ............ *G01R 27/14* (2013.01); *G01R 31/374* (2019.01); *G01R 31/3835* (2019.01); *H01M 10/48* (2013.01); *H01M 50/583* (2021.01); *H02H 7/18* (2013.01); *H01M 2200/00* (2013.01); *H01M 2220/20* (2013.01)

(58) Field of Classification Search
  CPC .......................... G01R 31/3835; G01R 31/374; G01R 31/382; G01R 31/364; H02H 1/0007; H02H 7/18; B60L 3/0046; B60L 58/10; B60L 2240/549; H01M 10/48; H01M 10/425; H01M 10/42; H01M 50/583; H01M 2010/4271; H01M 2200/00; H01M 2220/20; H01H 9/52; H01H 39/006; H01H 71/125; H01H 2039/008; Y02E 60/10
  USPC ........................................................ 361/93.7
  See application file for complete search history.

(56) References Cited

U.S. PATENT DOCUMENTS

| | | |
|---|---|---|
| 2008/0030208 A1 | 2/2008 | Aratani |
| 2011/0001212 A1 | 1/2011 | Kim |
| 2015/0375634 A1 | 12/2015 | Kim et al. |
| 2016/0204597 A1 | 7/2016 | Hotta |
| 2017/0023618 A1 | 1/2017 | Douglass et al. |
| 2017/0133133 A1 | 5/2017 | Kang et al. |
| 2020/0161714 A1* | 5/2020 | Lee .................. H01M 10/425 |
| 2020/0243290 A1 | 7/2020 | Sax et al. |
| 2021/0048454 A1 | 2/2021 | Choi |
| 2021/0375510 A1 | 12/2021 | Kim |

FOREIGN PATENT DOCUMENTS

| | | | |
|---|---|---|---|
| CN | 210404710 U | * | 4/2020 |
| DE | 102016216829 A1 | | 3/2018 |
| JP | 06294821 A | * | 10/1994 |
| JP | 2005127832 A | | 5/2005 |
| JP | 200839571 A | | 2/2008 |
| JP | 4069219 B2 | | 4/2008 |
| JP | 2009052898 A | | 3/2009 |
| JP | 4272044 B2 | | 6/2009 |
| JP | 2012059815 A | | 3/2012 |
| JP | 5928430 B2 | | 6/2016 |
| JP | 6034710 B2 | | 11/2016 |
| JP | 2017505899 A | | 2/2017 |
| JP | 2018-523121 A | | 8/2018 |
| JP | 2020-106330 A | | 7/2020 |
| KR | 20110002707 A | | 1/2011 |
| KR | 101461829 B1 | | 11/2014 |
| KR | 101614202 B1 | | 4/2016 |
| KR | 2016112417 A | * | 9/2016 .......... H01M 10/425 |
| KR | 20160112417 A | | 9/2016 |
| KR | 101720931 B1 | | 4/2017 |
| KR | 20190108999 A | | 9/2019 |
| KR | 20200036934 A | | 4/2020 |
| KR | 20200059000 A | | 5/2020 |
| KR | 20200075445 A | | 6/2020 |

OTHER PUBLICATIONS

Machine translation of Oribuie Japanese Patent Document JP H06-294821 A Oct. 1994 (Year: 1994).*

Machine translation of Li et al. Chinese Patent Document CN 210404710 U Apr. 2020 (Year: 2020).*

Extended European Search Report including Written Opinion for Application No. 21847084.7 dated Oct. 11, 2023, pp. 1-8.

International Search Report for Application No. PCT/KR2021/009064 mailed Nov. 1, 2021, pp. 1-3.

Communication pursuant to Article 94(3) EPC, from EP Application No. 21847084.7, dated Mar. 5, 2024, pp. 1-7.

* cited by examiner

CURRENT MEASUREMENT DEVICE

CROSS-REFERENCE TO RELATED APPLICATIONS

The present application is a national phase entry under 35 U.S.C. § 371 of International Application No. PCT/KR2021/009064 filed Jul. 14, 2021, which claims priority from Korean Patent Application No. 10-2020-0089756 filed Jul. 20, 2020, all of which are incorporated herein by reference.

TECHNICAL FIELD

The present disclosure relates to a current measurement apparatus, and more particularly, to a current measurement apparatus configured to quickly block current by itself when an abnormal current flows, and a battery pack and a vehicle including the current measurement apparatus.

BACKGROUND ART

Currently commercialized secondary batteries include nickel-cadmium batteries, nickel-hydrogen batteries, nickel-zinc batteries, lithium secondary batteries, and the like. Among them, the lithium secondary batteries are spotlighted because they ensure free charging and discharging due to substantially no memory effect compared to nickel-based secondary batteries, as well as very low discharge rate and high energy density.

The lithium secondary battery mainly uses lithium-based oxide and carbon material as positive electrode active material and negative electrode active material, respectively. The lithium secondary battery includes an electrode assembly in which a positive electrode plate and a negative electrode plate respectively coated with a positive electrode active material and a negative electrode active material are arranged with a separator interposed therebetween, and an exterior, namely a battery case, for hermetically receiving the electrode assembly together with electrolyte.

In particular, in recent years, as the use of electric vehicles as well as portable devices such as smart phones and laptops has become increasingly common, interest in battery packs used therefor is concentrated and research is being actively conducted.

As the application area of the battery pack is further expanded as above, the safety of the battery pack is emerging as a very important issue. In particular, users of electric vehicles are rapidly increasing, and the failure to secure the safety of the battery may lead to damage to the vehicle as well as casualties of occupants. Moreover, if a problem occurs in the battery pack while the electric vehicle is running, it may cause a traffic accident, or the like, resulting in very serious human and property damage. Accordingly, the battery pack is generally provided with various management means for managing the charging and discharging of the battery pack and securing safety.

Such a means for securing the safety of a battery pack may include various components. Typically, such components may include a current sensor provided on a path through which a charging and discharging current flows, and a control device such as a battery management system (BMS) that blocks the charging and discharging path when overcurrent occurs. In this configuration, the current sensing information measured by the current sensor is transmitted to the control device, and the control device may operate a current blocking element such as a fuse, a switch or a relay according to the current sensing information.

However, such an overcurrent blocking configuration may not operate quickly. That is, in the case of the overcurrent blocking configuration, communication must be made between the current sensor and the control unit, and thus a time delay may occur. For example, the current sensing information measured by the current sensor is transmitted to the BMS, and the BMS may check whether there is an overcurrent based on the transmitted current sensing information and then transmits a signal to the current blocking element to block the charging and discharging path. However, according to this current blocking configuration, since the current sensing information must be transmitted to the control device such as a BMS and a control signal for blocking current must be transmitted from the control device such as BMS to the current blocking element, the current blocking operation may not be performed quickly.

DISCLOSURE

Technical Problem

The present disclosure is designed to solve the problems of the related art, and therefore the present disclosure is directed to providing a current measurement apparatus, which may quickly perform a current blocking function by itself without using a separate control device such as a BMS, and a battery pack and a vehicle including the current measurement apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a current measurement apparatus, comprising: an electrically conductive first terminal; an electrically conductive second terminal spaced apart from the first terminal by a predetermined distance; an electrically conductive resistor positioned in a space between the first terminal and the second terminal, wherein a material of the electrically conductive resistor has a greater specific resistance than materials of the first terminal and the second terminal; a circuit board including an electric path, the circuit board positioned at a side portion of the first terminal and a side portion of the second terminal, and electrically connected to the first terminal and the second terminal, respectively; and a control unit mounted on the circuit board and configured to measure a current flowing in the resistor based on a voltage value between the first terminal and the second terminal and a resistance value of the resistor, wherein the control unit is configured to issue a control signal to cut the resistor based on the measured current.

Here, each of the first terminal and the second terminal may be a plate positioned on the a plane as the circuit board.

In addition, the circuit board may include a body portion positioned at the side portion of the first terminal and the side portion of the second terminal, a first extending portion extending horizontally from the body portion and positioned on a surface of the first terminal, and a second extending portion positioned on a surface of the second terminal.

In addition, the apparatus may further include gunpowder, an ignition switch, a cylinder, and a piston, and the cylinder may be positioned at least partially above the surfaces of both the first extending portion and the second extending portion.

In addition, the cylinder nay include a main body positioned above a space between the first extending portion and the second extending portion and a lower protrusion extending outward from the main body in a horizontal direction and positioned at least partially above each of the first extending portion and the second extending portion.

In addition, the circuit board may be configured to be removeably attached to the first terminal and the second terminal.

In addition, the control signal may cause the resistor to be cut by exploding the gunpowder.

In addition, the apparatus may further include a press configured to press the resistor in response to explosion of the gunpowder, and a cover, the resistor may be positioned between the press and the cover, and the cover may be configured to prevent scattering of the resistor when cut by the press.

In addition, the circuit board may include a heat dissipation member positioned on a surface of the circuit board, and a heat transfer material interposed between the heat dissipation member and at least one of the first terminal, the resistor or the second terminal.

In another aspect of the present disclosure, there is also provided a battery pack, comprising the current measurement apparatus according to any of the embodiments of the present disclosure.

In another aspect of the present disclosure, there is also provided a vehicle, comprising the current measurement apparatus according to any of the embodiments of the present disclosure.

Advantageous Effects

According to the present disclosure, when an abnormal situation such as overcurrent occurs, it is possible to quickly block the overcurrent.

In particular, according to an embodiment of the present disclosure, when overcurrent is measured by the current measurement apparatus, there is no need to communicate with a control device such as a BMS in order to block the overcurrent.

Therefore, it is possible to quickly prevent problems caused by overcurrent by shortening the operation time for blocking the overcurrent.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
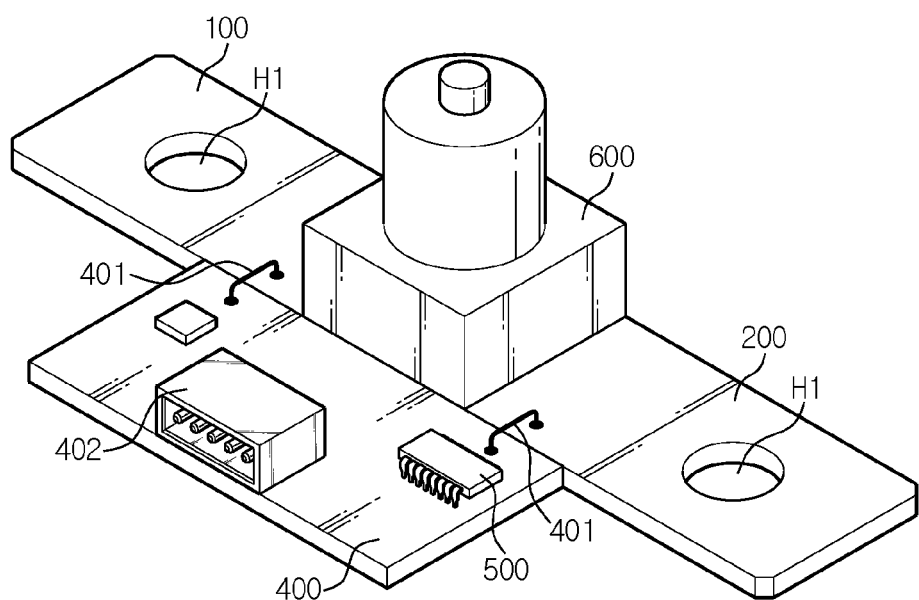
FIG. 1 is an exploded perspective view schematically showing a configuration of a current measurement apparatus according to an embodiment of the present disclosure.
Figure 2:
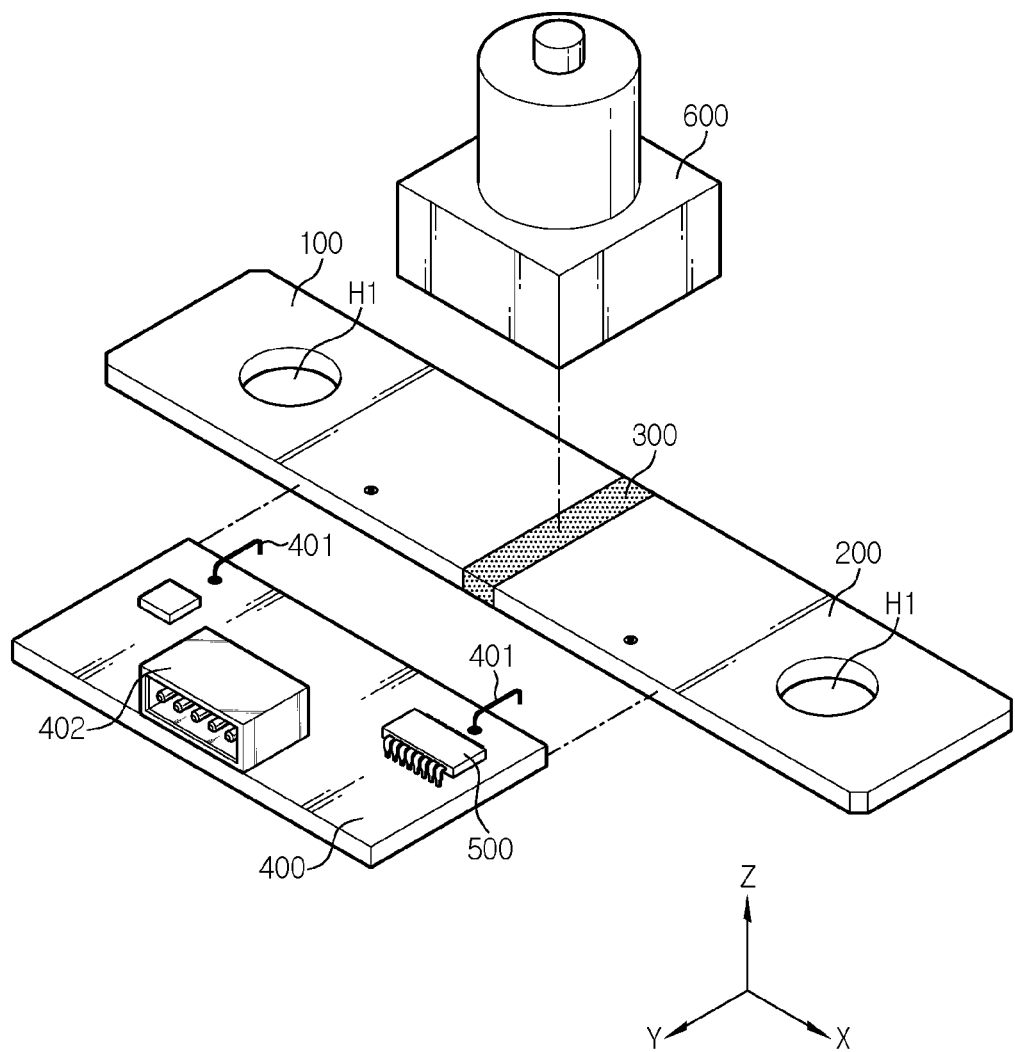
FIG. 2 is an assembled perspective view of FIG. 1.

FIG. 1 is an exploded perspective view schematically showing a configuration of a current measurement apparatus according to an embodiment of the present disclosure, and FIG. 2 is an assembled perspective view of FIG. 1.

Referring to FIGS. 1 and 2, the current measurement apparatus according to the present disclosure includes a first terminal 100, a second terminal 200, a resistor 300, a circuit board 400, a control unit 500, and a cutting unit 600.

The first terminal 100 and the second terminal 200 may be made of an electrically conductive material. For example, the first terminal 100 and the second terminal 200 may be made of a metal material such as copper.

The first terminal 100 and the second terminal 200 may be respectively connected to one side and the other side on a path through which current flows. For example, when the current measurement apparatus according to the present disclosure is employed on a charging and discharging path of a battery pack, the ends of the first terminal 100 and the second terminal 200 may be respectively connected to different charging and discharging bus bars, which constitute the same charging and discharging path of a battery pack. To this end, the first terminal 100 and the second terminal 200 may have a terminal hole, as indicated by H1 in the drawing, such that the terminal hole is coupled to the hole of the charging and discharging bus bar of the battery pack by bolting.

The first terminal 100 and the second terminal 200 may be disposed to be spaced apart from each other by a predetermined distance. For example, seeing the configuration of FIG. 2, the first terminal 100 and the second terminal 200 may be configured to be spaced apart by a predetermined distance in a left and right direction (x-axis direction of the drawing).

The resistor 300 may be configured to be interposed in a separated space between the first terminal 100 and the second terminal 200. In addition, the resistor 300 may be configured to be fixedly coupled to the first terminal 100 and the second terminal 200. For example, the resistor 300 may have one end (left end) coupled and fixed with the first terminal 100 and the other end (right end) coupled and fixed with the second terminal 200. At this time, the resistor 300 and the first terminal 100 and/or the second terminal 200 may be coupled by welding or the like, but various other coupling types may also be employed.

The resistor 300 may be made of an electrically conductive material having a greater resistance value, particularly a greater specific resistance, than the first terminal 100 and the second terminal 200. For example, the resistor 300 may be made of an alloy material containing at least two or more of manganese (Mn), nickel (Ni), and copper (Cu).

The material, configuration, shape, or the like of the first terminal 100, the second terminal 200 and the resistor 300 may employ those of a current sensor having a shunt resistor known at the time of filing of this application.

The circuit board 400 is configured in a plate shape, like a printed circuit board (PCB), and may be configured to form an electric path on a surface thereof or at the inside thereof. In addition, the circuit board 400 may be located at a side portion of the first terminal 100 and the second terminal 200. In particular, the circuit board 400 may be configured to be located at a side portion not in a direction where the first terminal 100 and the second terminal 200 are coupled but in a direction orthogonal thereto. For example, seeing the configuration of FIGS. 1 and 2, the first terminal 100 and the second terminal 200 may be configured to be coupled in the left and right direction (x-axis direction of the drawing) with the resistor 300 interposed therebetween, and the circuit board 400 may be configured to be coupled in the front and rear direction (y-axis direction in the drawing). For example, the circuit board 400 may be configured to be located at a front end of the first terminal 100, the second terminal 200, and the resistor 300.

The circuit board 400 may be configured to be electrically connected to the first terminal 100 and the second terminal 200, respectively. For example, as shown in the drawings, the circuit board 400 may include a plurality of measurement wires 401 made of a material through which an electric signal can be transmitted. In addition, the circuit board 400 may be electrically connected to the first terminal 100 through one of the measurement wires 401, and may be electrically connected to the second terminal 200 through another measurement wire 401. In addition, the measurement wire 401 may be connected and fixed to a conductor pattern or the like formed on the circuit board 400. In this case, the bonding and fixing between the measurement wire 401 and the terminals 100, 200 and/or between the measurement wire 401 and the circuit board 400 may be performed by soldering or the like, but various other bonding and fixing manners may also be implemented.

The control unit 500 may be mounted on the circuit board 400 and configured to measure the magnitude of current flowing through the resistor 300. More specifically, the control unit 500 may obtain a potential between the first terminal 100 and the second terminal 200 through the measurement wire 401. In addition, the control unit 500 may store the resistance value of the resistor 300 in advance in a memory or the like. Accordingly, the control unit 500 may measure the magnitude of the current flowing through the resistor 300 by using the obtained voltage value between the first terminal 100 and the second terminal 200 and the resistance value of the resistor 300 stored in advance.

The control unit 500 may be implemented in various forms such as a processor or a chipset known in the art, which may execute various control logics for measuring current and be mounted on the circuit board 400.

The cutting unit 600 may be located above or below the resistor 300. For example, the cutting unit 600 may be configured to be placed on an upper surface of the resistor 300 as shown in FIGS. 1 and 2. In this case, the cutting unit 600 may be configured to be also placed on an upper portion or a lower portion of the first terminal 100 and the second terminal 200 together with the resistor 300. For example, as shown in FIGS. 1 and 2, a lower part of the cutting unit 600 may be placed in contact with the upper surface of the first terminal 100, another lower part thereof is may be placed in contact with the upper surface of the resistor 300, and still another lower part thereof may be placed in contact with the upper surface of the second terminal 200.

The cutting unit 600 may be configured to cut the resistor 300 according to a control signal of the control unit 500. In other words, the control unit 500 may control the cutting unit 600 to cut the resistor 300. To this end, the control unit 500 and the cutting unit 600 may be configured to send and receive electric signals to each other. For example, the control unit 500 and the cutting unit 600 may be configured to be electrically connected to each other through a component such as a flexible printed circuit board (FPCB) or a wire. In this case, the contact point between the FPCB or the like and the control unit 500 and/or the cutting unit 600 may be coated with a waterproof material. Also, the control unit 500 and the cutting unit 600 may be configured to exchange signals with each other via an electric path of the circuit board 400, namely a conductor pattern.

The control unit 500 may be configured to transmit a control signal for cutting to the cutting unit 600 when the current flowing through the resistor 300 is equal to or greater than a reference current. In this case, the reference current may be stored in advance in a memory device of the control unit 500 or the like. In addition, when the control signal for cutting is received from the control unit 500, the cutting unit 600 may be configured to cut the resistor 300.

The cutting unit 600 may be configured to cut the resistor 300 by applying a physical force to the resistor 300. In addition, by the physical separation of the resistor 300, the flow of current through the first terminal 100, the resistor 300 and the second terminal 200 may be blocked. That is, if the resistor 300 is separated from the first terminal 100 and the second terminal 200, the electric connection state between the first terminal 100 and the second terminal 200 is cut off, and the flow of current passing through the first terminal 100, the resistor 300 and the second terminal 200 may not be formed any longer.

In particular, in the current measurement apparatus according to the present disclosure, the cutting unit 600 may be configured to press only the resistor 300 with respect to an assembly of the first terminal 100, the resistor 300 and the second terminal 200. In this case, the assembly of the first terminal 100, the resistor 300 and the second terminal 200 may be separated more easily. That is, the resistor 300 may be coupled and fixed with the first terminal 100 and the second terminal 200 by welding or the like, and the coupled and fixed portions between the resistor 300 and the first terminal 100 and between the resistor 300 and the second terminal 200 may be separated at one time by applying a physical force to the resistor 300. Therefore, in this case, the current may be blocked more quickly.

In addition, according to the configuration of the present disclosure, the current blocking performance may be stably secured with a simple structure. In particular, in the embodiment of the present disclosure, the circuit board 400 may be located at the side surface of the first terminal 100, the resistor 300 and the second terminal 200, and the cutting unit 600 may be located above or below the first terminal 100, the resistor 300 and the second terminal 200. Thus, the cutting unit 600 may not disturb a connecting component such as a connection pin for measurement or the measurement wire 401 for the connection between the first terminal 100 and the circuit board 400 and between the second terminal 200 and the circuit board 400. In particular, the measurement wire 401 or the like does not need to be provided in a long shape. Therefore, the accuracy for current measurement and the structural coupling force between the circuit board 400 and the first terminal 100 and between the circuit board 400 and the second terminal 200 may be further improved.

Moreover, according to the embodiment of the present disclosure, it is advantageous to implement a current measurement apparatus having a compact size. That is, the current measurement apparatus of the present disclosure may have both the current measurement performance and the current blocking performance, without excessively increasing the volume. Therefore, when the current measurement apparatus is mounted to a battery pack or the like, the battery pack or the like may be designed easily, and the volume of the battery pack or the like may be prevented from increasing.

In addition, according to an embodiment of the present disclosure, the cutting unit 600 may be disposed above the resistor 300. In this case, the upper portion of the resistor 300 may be covered by the cutting unit 600, thereby more effectively preventing moisture or water existing inside the current measurement apparatus from being introduced toward the resistor 300. In particular, if there is moisture or water in the resistor 300, the accuracy of current measurement may deteriorate. According to this embodiment of the present disclosure, the cutting unit 600 prevents moisture or water droplets from being introduced toward the upper portion of the resistor 300, thereby preventing the accuracy of current measurement from deteriorating.

Meanwhile, as shown in FIGS. 1 and 2, the circuit board 400 may include a connector 402 for communication with an external device. For example, when the current measurement apparatus according to the present disclosure is mounted to the battery pack, a BMS provided in the battery pack may be connected to the current measurement apparatus through the connector 402. In addition, the BMS may receive the current measurement information of the current measurement apparatus through the connector 402. Also, the circuit board 400 may further include various other components in addition to the connector 402 and the control unit 500.

The first terminal 100 and the second terminal 200 may be configured in a plate shape, as shown in FIGS. 1 and 2. For example, the first terminal 100 and the second terminal 200 may be configured in the form of a copper plate.

In addition, the circuit board 400 may also be configured in a plate shape. In this case, the first terminal 100 and the second terminal 200 may be configured to be located on the same plane as the circuit board 400. More specifically, the first terminal 100 and the second terminal 200 may be configured such that two wide surfaces are laid down to face upward and downward. In addition, the circuit board 400 may also be configured such that two wide surfaces are laid down to face upward and downward.

In this case, the first terminal 100, the second terminal 200 and the circuit board 400 may be configured to be located on the same plane. For example, the first terminal 100, the second terminal 200 and the circuit board 400 may all have a lower surface parallel to the x-y plane.

According to this configuration of the present disclosure, a current measurement apparatus having a more compact size may be implemented. In addition, according to the embodiment, the first terminal 100, the second terminal 200 and the circuit board 400 may be stably mounted on the bottom surface of the current measurement apparatus.

Figure 3:
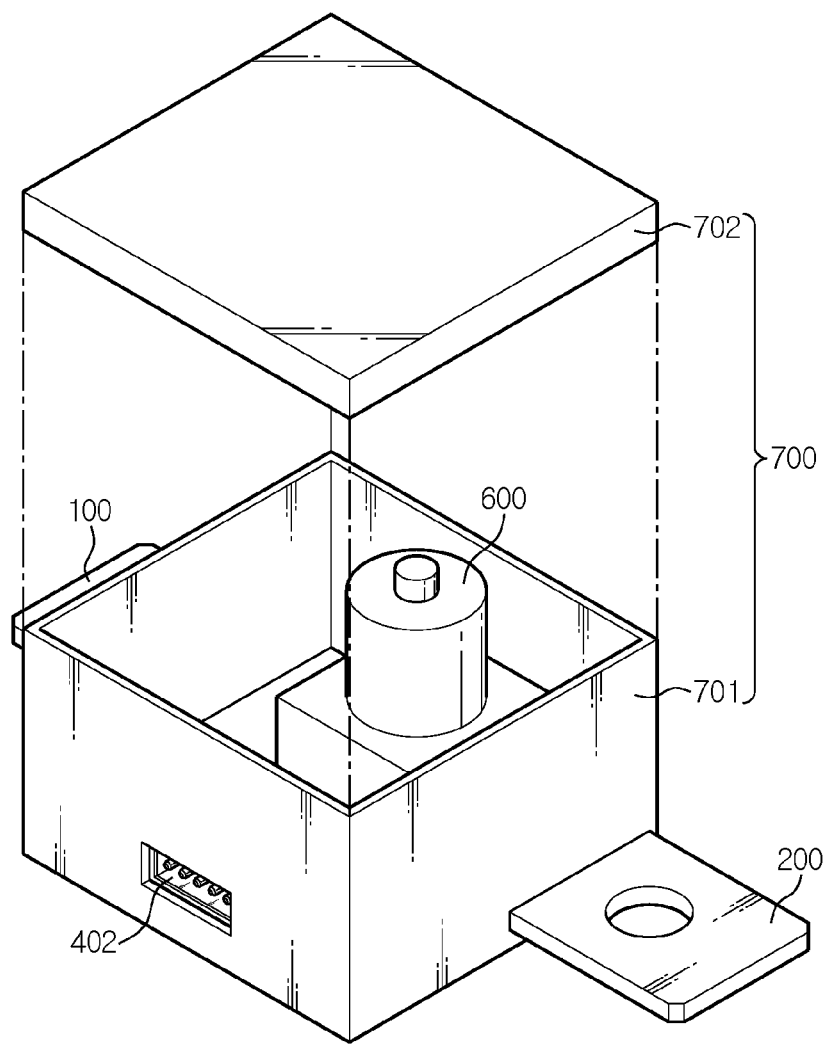
FIG. 3 is an exploded perspective view schematically showing a configuration of the current measurement apparatus according to an embodiment of the present disclosure.

FIG. 3 is an exploded perspective view schematically showing a configuration of the current measurement apparatus according to an embodiment of the present disclosure. In FIG. 3, features different from the former embodiment of FIGS. 1 and 2 will be described in detail.

Referring to FIG. 3, the current measurement apparatus according to the present disclosure may further include a case 700. The case 700 is an exterior material of the current measurement apparatus, and may be configured to have an inner space for accommodating at least a part of other components of the current measurement apparatus, such as the first terminal 100, the second terminal 200, the resistor 300, the circuit board 400, the control unit 500 and the cutting unit 600.

For example, the case 700 may be configured to include a lower case 701 and an upper case 702. In particular, an inner space is formed in the lower case 701 to accommodate other components of the current measurement apparatus, but an open portion may be formed at a top end thereof. Also, the upper case 702 may be coupled to the top open portion of the lower case 701.

The case 700 may protect various components provided therein from external physical and chemical factors. However, the case 700, for example the lower case 701, may be configured such that the first terminal 100 and the second terminal 200 are partially exposed to the outside for electric connection to the charging and discharging bus bar or the like. In addition, the case 700 may also be configured to expose the connector 402 to the outside, so that an external device such as a BMS may be easily connected to the connector 402 or the like.

Figure 4:
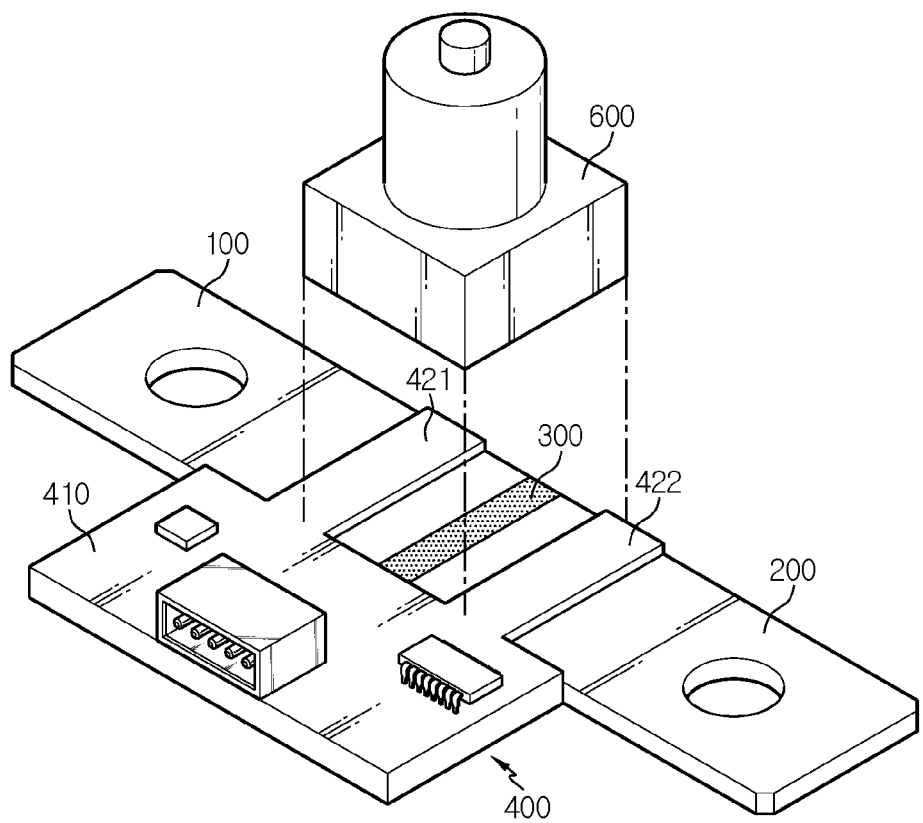
FIG. 4 is an exploded perspective view schematically showing a configuration of a current measurement apparatus according to another embodiment of the present disclosure.
Figure 5:
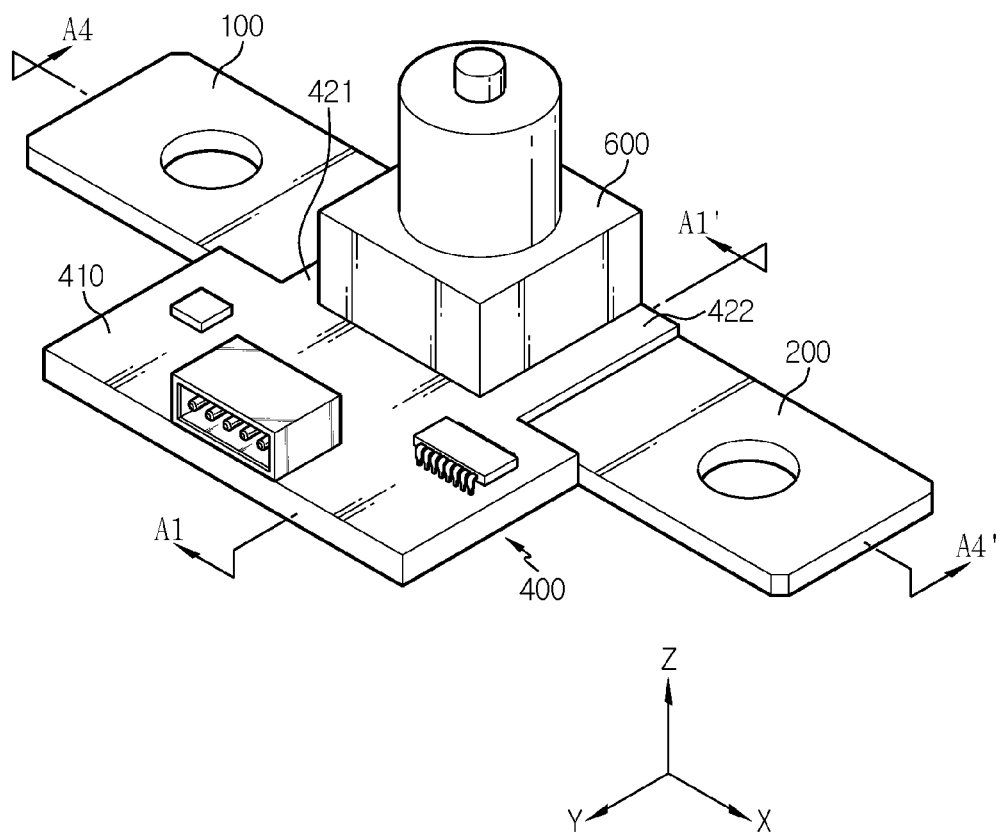
FIG. 5 is an assembled perspective view of FIG. 4.
Figure 6:
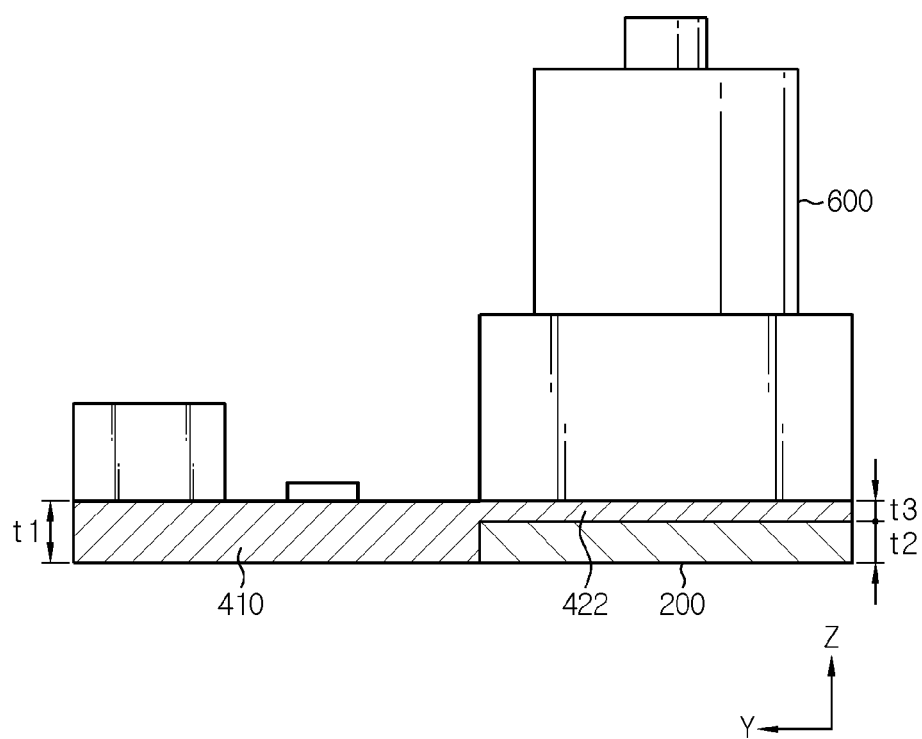
FIG. 6 is a sectional view, taken along the line A1-A1' of FIG. 5.

FIG. 4 is an exploded perspective view schematically showing a configuration of a current measurement apparatus according to another embodiment of the present disclosure, FIG. 5 is an assembled perspective view of FIG. 4, and FIG. 6 is a sectional view, taken along the line A1-A1' of FIG. 5. In this embodiment, features different from the former embodiments will be described in detail, and features identical or similar thereto will not be described in detail.

Referring to FIGS. 4 to 6, the circuit board 400 may include a body portion 410 and an extending portion. In particular, the extending portion may include a first extending portion 421 and a second extending portion 422.

The body portion 410 is a configuration located at the side portion of the first terminal 100 and the second terminal 200, and may be regarded as having a configuration corresponding to the circuit board 400 of FIGS. 1 and 2 as above. Accordingly, a conductor pattern may be formed on the body portion 410, and the control unit 500 may be mounted thereto.

The first extending portion 421 may be formed to extend in a horizontal direction from the body portion 410. For example, as shown in FIG. 4, the first extending portion 421 may be configured to extend in a y-axis direction, particularly in a -y-axis direction, on the x-y plane. In addition, as shown in FIGS. 4 and 5, the first extending portion 421 may be configured to be placed on a surface of the first terminal 100, for example an upper surface of the first terminal 100.

The second extending portion 422 may be configured to extend in a horizontal direction from the body portion 410, particularly to extend in a direction parallel to the extending direction of the first extending portion 421. For example, referring to FIG. 4, the second extending portion 422 may be configured to extend in the -y-axis direction, similar to the first extending portion 421. In addition, the second extending portion 422 may be configured to be placed on a surface of the second terminal 200, for example an upper surface of the second terminal 200, as shown in FIGS. 4 to 6.

According to this configuration of the present disclosure, the coupling between the circuit board 400 and a resistor assembly, which is an assembly of the first terminal 100, the resistor 300 and the second terminal 200, may be improved. In particular, since the first extending portion 421 and the second extending portion 422 are disposed on the upper portion or the lower portion of the first terminal 100 and the second terminal 200, it is possible to restrict upward or downward movement of the first terminal 100 and the second terminal 200. Accordingly, the mechanical coupling between the resistor assembly and the circuit board 400 may be improved.

In addition, the circuit board 400 and each terminal may be electrically connected through the first extending portion 421 and the second extending portion 422. For example, the conductor pattern formed on the body portion 410 may extend to the first extending portion 421 and the second extending portion 422. In addition, the conductor pattern formed on the first extending portion 421 and the second extending portion 422 may be connected to the first terminal 100 and the second terminal 200. For example, when the conductor patterns of the first extending portion 421 and the second extending portion 422 are formed to be buried inside a polymer layer, at least a part of the conductor pattern may be configured to be exposed to the outside of the polymer layer. In addition, the exposed part of the conductor pattern as described above may be in contact with the first terminal 100 and the second terminal 200 to be electrically connected to the first terminal 100 and the second terminal 200. According to this embodiment of the present disclosure, the circuit board 400 and each terminal may be electrically connected more easily. In particular, in this embodiment, an electric connection element such as the measurement wire 401 as shown in FIGS. 1 and 2 may not be included outside the circuit board 400.

Meanwhile, in this embodiment, the thickness of the circuit board 400, particularly the thickness of the body portion 410, may be configured to be greater than the thickness of the first terminal 100 and the second terminal 200.

For example, seeing the configuration shown in FIG. 6, in the circuit board 400, assuming that the vertical thickness of the body portion 410 is t1 and the vertical thickness of the second terminal 200 is t2, t1 and t2 may be configured to establish the following relationship.

$$t1 > t2.$$

In particular, assuming that the vertical thickness of the second extending portion 422 extending from the body portion 410 of the circuit board 400 is t3, the following relationship may be established for t1, t2 and t3.

$$t1 \geq t2 + t3.$$

In particular, t1 may be equal to the sum of t2 and t3.

According to this configuration of the present disclosure, the thickness of the laminate of the second extending portion 422 and the second terminal 200 is the same as the thickness of the body portion 410. Accordingly, the lower surface of the body portion 410 may be located on the same plane as the lower surface of the second terminal 200, and the upper surface of the body portion 410 may be located on the same plane as the upper surface of the second extending portion 422. In addition, this configuration may be identically applied to the first extending portion 421 and the first terminal 100. Accordingly, the bonding state among the circuit board 400, the terminal and the cutting unit 600 may be more stably maintained.

As described above, in the embodiment where the first extending portion 421 and the second extending portion 422 are provided on the circuit board 400, the cutting unit 600 may be configured to be at least partially placed on the surfaces of both the first extending portion 421 and the second extending portion 422.

For example, as shown in FIGS. 4 and 5, a lower portion of one side of the cutting unit 600, for example a lower left side, may be placed on the first extending portion 421, and a lower portion of the other side of the cutting unit 600, for example a lower right side, may be placed on the second extending portion 422.

According to this configuration of the present disclosure, the coupling between the cutting unit 600 and the circuit board 400 may be improved. For example, since the outer portions of the first extending portion 421 and the second extending portion 422 of the circuit board 400, namely the upper surfaces thereof, are configured to be flat, the cutting unit 600 may be stably placed on the flat surface. In addition, according to this configuration, since an empty space is formed between the first extending portion 421 and the second extending portion 422 above the resistor 300, it is possible to secure a space for locating the cutting configuration of the cutting unit 600 to cut the resistor 300. In addition, according to this configuration, when the resistor 300 is cut by the cutting unit 600, the first extending portion 421 and the second extending portion 422 serve to block fragments of the resistor 300, thereby preventing the fragments from scattering to the outside. Moreover, according to this configuration, since the cutting unit 600 and the resistor assembly may not directly contact each other, it is possible to prevent the accuracy of current measurement from deteriorating due to current leakage or contact resistance.

Figure 7:
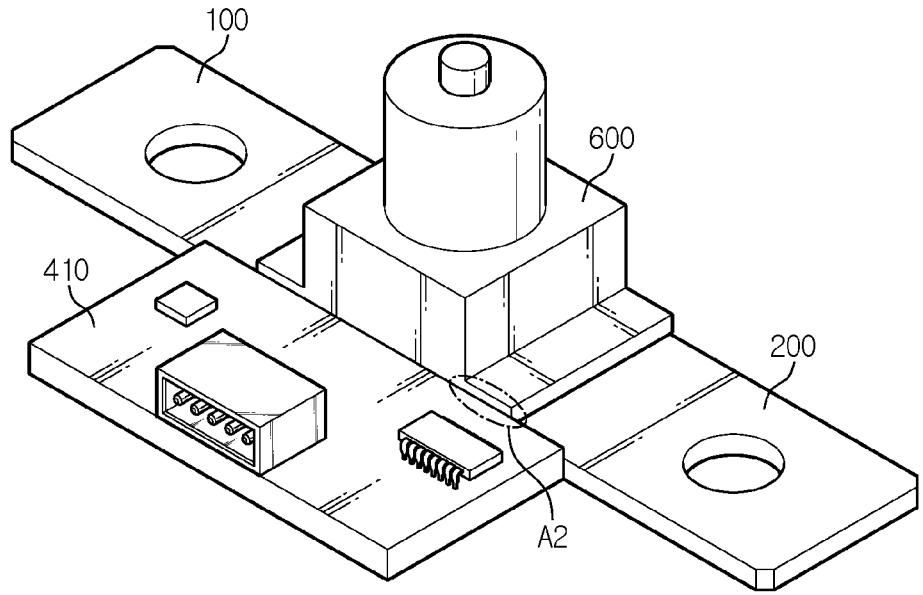
FIG. 7 is a perspective view schematically showing a configuration of a current measurement apparatus according to still another embodiment of the present disclosure.
Figure 8:
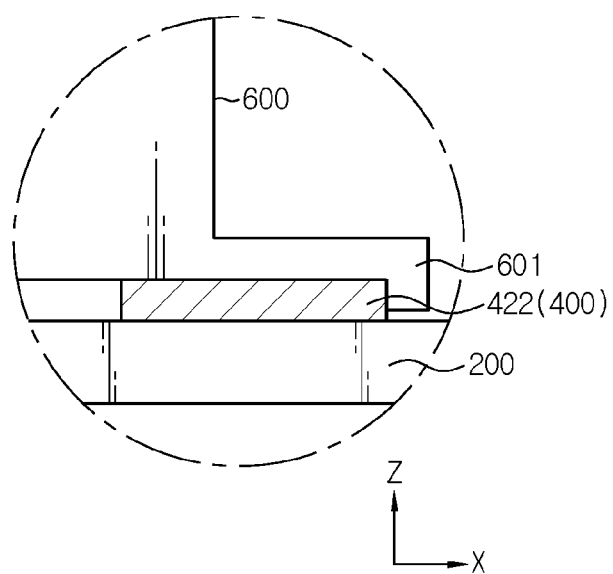
FIG. 8 is an enlarged sectional view showing a portion A2 of FIG. 7.

FIG. 7 is a perspective view schematically showing a configuration of a current measurement apparatus according to still another embodiment of the present disclosure, and FIG. 8 is an enlarged sectional view showing a portion A2 of FIG. 7. In this embodiment, features different from the former embodiments will be described in detail.

Referring to FIGS. 7 and 8, the cutting unit 600 may be configured to protrude in an outer horizontal direction further to the first extending portion 421 and the second extending portion 422. That is, the cutting unit 600 may include a lower protrusion 601 protruding outward further to the first extending portion 421 and the second extending portion 421. For example, referring to FIG. 8, a lower right end of the cutting unit 600 is placed on the second extending portion 422, and the right end of the cutting unit 600 may be configured to protrude in the right direction (+x-axis direction in the drawing) further to the second extending portion 422, thereby forming the lower protrusion 601. Moreover, the lower protrusion 601 may be configured to be bent downward (−z-axis direction in the drawing) in the form of surrounding the outer side of the second extending portion 422 in a state of extending to the right further to the second extending portion 422. That is, the lower protrusion 601 of the cutting unit 600 may be configured to be bent in the form of surrounding the outer side of the second extending portion 422. In addition, although FIG. 8 shows the configuration between the lower right end of the cutting unit 600 and the second extending portion 422, the lower protrusion 601 may also be configured in a similar shape between the lower left end of the cutting unit 600 and the first extending portion 421. That is, at the lower left side of the cutting unit 600, the lower protrusion 601 configured to be bent in the form of surrounding the outer side, namely the left side, of the first extending portion 421 may be provided.

According to this configuration of the present disclosure, since the first extending portion 421 and the second extending portion 422 of the circuit board 400 are surrounded by the lower protrusion 601 of the cutting unit 600, it is possible to more effectively prevent foreign substances, particularly moisture or the like, from being introduced toward the resistor 300. That is, according to this configuration, the gap between the lower surface of the cutting unit 600 and the upper surface of the first extending portion 421 or the second extending portion 421 may not be exposed to the outside by the lower protrusion 601. Accordingly, it is possible to more reliably prevent foreign substances such as moisture from being introduced toward the resistor 300 located between the first extending portion 421 and the second extending portion 422 in the horizontal direction. Moreover, under high humidity or rain conditions, water droplets may flow downward along the surface of the cutting unit 600, but in this case, it is possible to prevent the water droplets from moving toward the lower protrusion 601 and penetrating toward the resistor 300. In addition, the lower protrusion 601 may cover the side surfaces of the first extending portion 421 and the second extending portion 422 to protect the first extending portion 421 and the second extending portion 422 from external shocks or the like.

Figure 9:
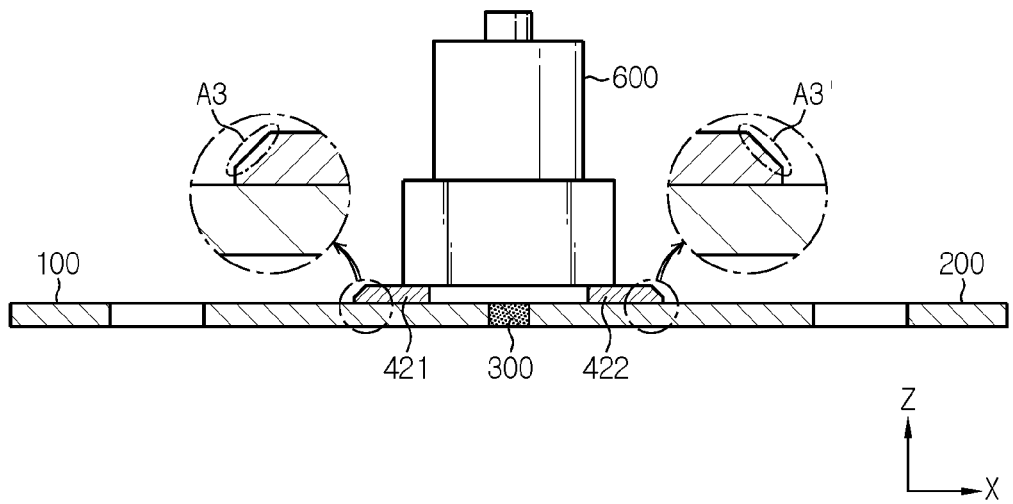
FIG. 9 is a front sectional view schematically showing a configuration of a current measurement apparatus according to still another embodiment of the present disclosure.

FIG. 9 is a front sectional view schematically showing a configuration of a current measurement apparatus according to still another embodiment of the present disclosure. FIG. 9 may be regarded as another modification of the sectional configuration along the line A4-A4' of FIG. 5. In this embodiment, features different from the former embodiments will be described in detail.

Referring to FIG. 9, the current measurement apparatus according to the present disclosure may be configured such that outer upper parts of the first extending portion 421 and the second extending portion 422 are chamfered. For example, the first extending portion 421 may be configured such that a left upper corner thereof is inclined, as indicated by A3 in FIG. 9. In addition, the second extending portion 422 may be configured such that a right upper corner is inclined, as indicated by A3' in FIG. 9. Moreover, the chamfered portion may be configured in a curved shape. In particular, in this embodiment, the chamfered portion may be formed in a region located outside the cutting unit 600 in the horizontal direction.

According to this configuration of the present disclosure, it is possible to more reliably prevent moisture or the like from penetrating toward the resistor 300. In particular, when a water droplet flows along the outer surface of the cutting unit 600, the water droplet falling onto the first extending portion 421 or the second extending portion 422 may flow more easily in a direction opposite to the resistor 300 through the chamfered portion. Therefore, it is possible to more reliably prevent the accuracy of current measurement from deteriorating due to the penetration of moisture toward the resistor 300.

Figure 10:
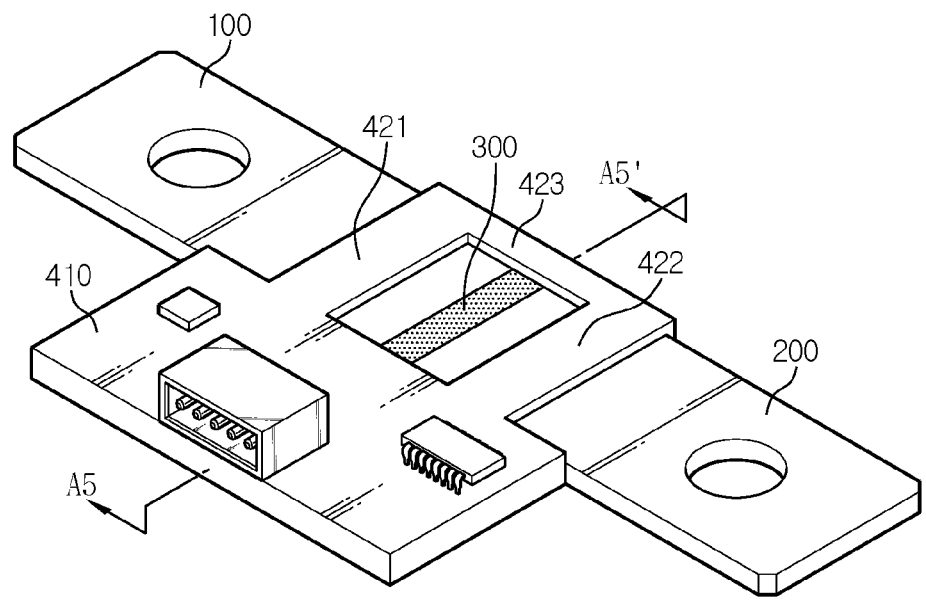
FIG. 10 is a perspective view schematically showing a configuration of a current measurement apparatus according to still another embodiment of the present disclosure.
Figure 11:
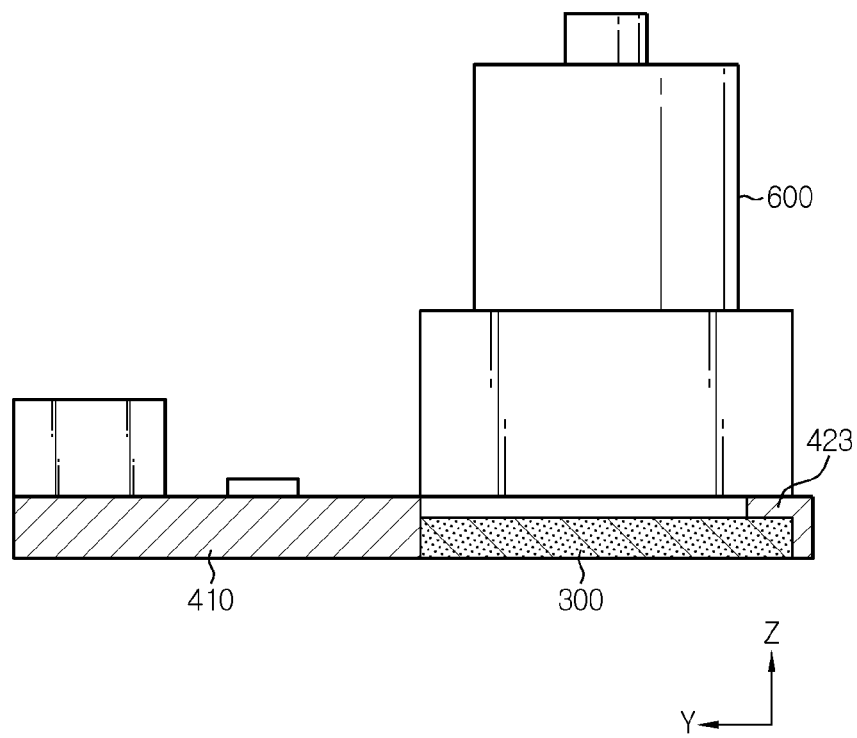
FIG. 11 is a sectional view, taken along the line A5-A5' of FIG. 10.

FIG. 10 is a perspective view schematically showing a configuration of a current measurement apparatus according to still another embodiment of the present disclosure, and FIG. 11 is a sectional view, taken along the line A5-A5' of FIG. 10. In FIG. 10, the cutting unit 600 is not illustrated for convenience of explanation. In this embodiment, features different from the former embodiments will be described in detail.

Referring to FIGS. 10 and 11, the circuit board 400 of the current measurement apparatus according to the present disclosure may include a third extending portion 423. Here, the third extending portion 423 may be configured to connect an end of the first extending portion 421 and an end of the second extending portion 422 to each other. For example, a left end of the third extending portion 423 may be connected to a rear end of the first extending portion 421, and a right end of the third extending portion 423 may be connected to a rear end of the second extending portion 422. In addition, the cutting unit 600 may be placed on the third extending portion 423. That is, as shown in FIG. 11, the rear end of the cutting unit 600 may be placed on the third extending portion 423. In this case, the cutting unit 600 may be regarded as being placed on all of the first extending portion 421, the second extending portion 422 and the third extending portion 423. Moreover, the cutting unit 600 may be partially placed on the body portion 410 as shown in FIG. 11.

According to this configuration of the present disclosure, the circuit board 400 is located in the horizontal direction, namely all of the front, rear, left and right directions, around the resistor 300. In addition, the cutting unit 600 is located on the resistor 300. Therefore, it is possible to more completely block the penetration of foreign substances such as moisture toward the resistor 300.

In particular, as shown in FIG. 11, the cutting unit 600 may also be configured to be partially placed on the body portion 410. In this case, the upper portion of the resistor 300 may be more reliably sealed by the cutting unit 600.

In addition, as shown in FIG. 11, the third extending portion 423 may be configured to be bent in the form of surrounding the outer side portion (rear side portion) of the resistor 300. That is, the third extending portion 423 may be configured to be bent downward in a shape of surrounding the rear side portion of the resistor 300. In addition, the circuit board 400 may be configured to have a thickness capable of blocking the other outer side portion (front side portion) of the resistor 300. In this case, the resistor 300 is more securely sealed from the outside by the body portion 410 and the third extending portion 423, thereby further improving the water penetration blocking effect to the resistor 300.

Figure 12:
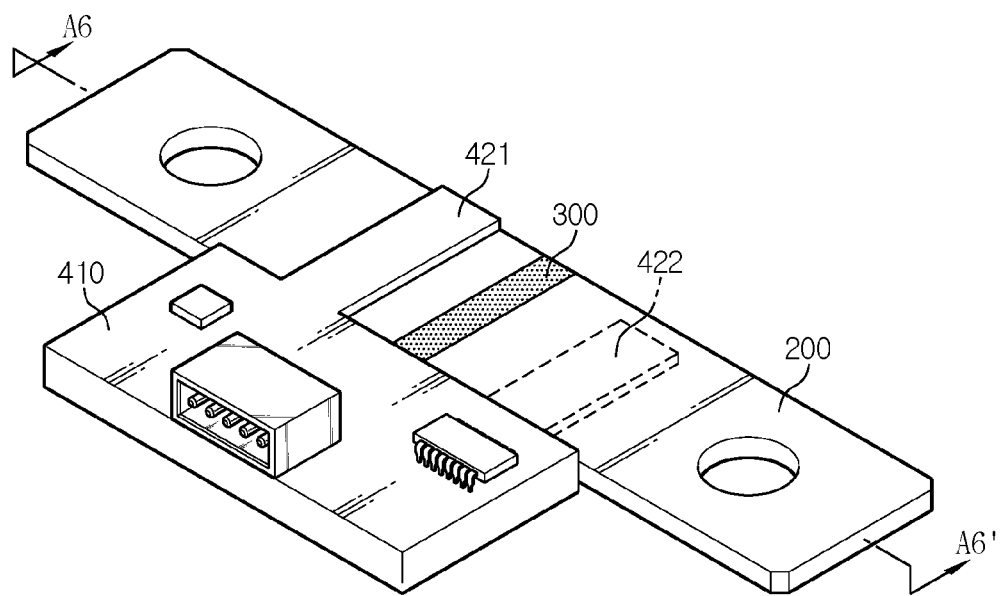
FIG. 12 is a perspective view schematically showing a configuration of a current measurement apparatus according to still another embodiment of the present disclosure.
Figure 13:
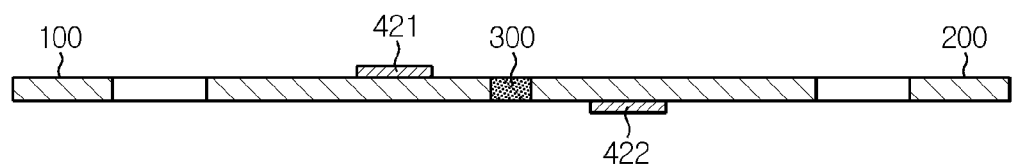
FIG. 13 is a sectional view, taken along the line A6-A6' of FIG. 12.

FIG. 12 is a perspective view schematically showing a configuration of a current measurement apparatus according to still another embodiment of the present disclosure, and FIG. 13 is a sectional view, taken along the line A6-A6' of FIG. 12. In FIGS. 12 and 13, components such as the cutting unit 600 are not illustrated for convenience of explanation. In this embodiment, features different from the former embodiments will be described in detail.

Referring to FIGS. 12 and 13, the first extending portion 421 and the second extending portion 422 may be configured to be located at different portions in the vertical direction based on the resistor 300. For example, referring to the drawings, the first extending portion 421 may be placed in contact with the upper surface of the first terminal 100, and the second extending portion 422 may be placed in contact with the lower surface of the second terminal 200.

According to this configuration of the present disclosure, the coupling force between the circuit board 400 and the resistor assembly including the first terminal 100, the resistor 300 and the second terminal 200 may be further increased. For example, in the embodiment of FIGS. 12 and 13, upward movement of the resistor assembly may be restricted by the first extending portion 421, and downward movement may be restricted by the second extending portion 422. That is, both upward and downward movement of the resistor assembly may be restricted by the circuit board 400. In particular, when the resistor 300 is pressed by the cutting unit 600 to cut the resistor 300, the first extending portion 421 or the second extending portion 422 may support the resistor assembly in a direction opposite to the pressing direction. Therefore, the resistor 300 may be cut by the cutting unit 600 more smoothly and quickly. In addition, according to the configuration, the coupling force between the circuit board 400 and the resistor assembly may be improved, thereby further enhancing the mechanical stability of the current measurement apparatus.

In the current measurement apparatus according to an embodiment of the present disclosure, the circuit board 400 may be configured to be detachably attached to the resistor assembly, particularly the first terminal 100 and the second terminal 200. This will be described in more detail with reference to FIG. 14.

Figure 14:
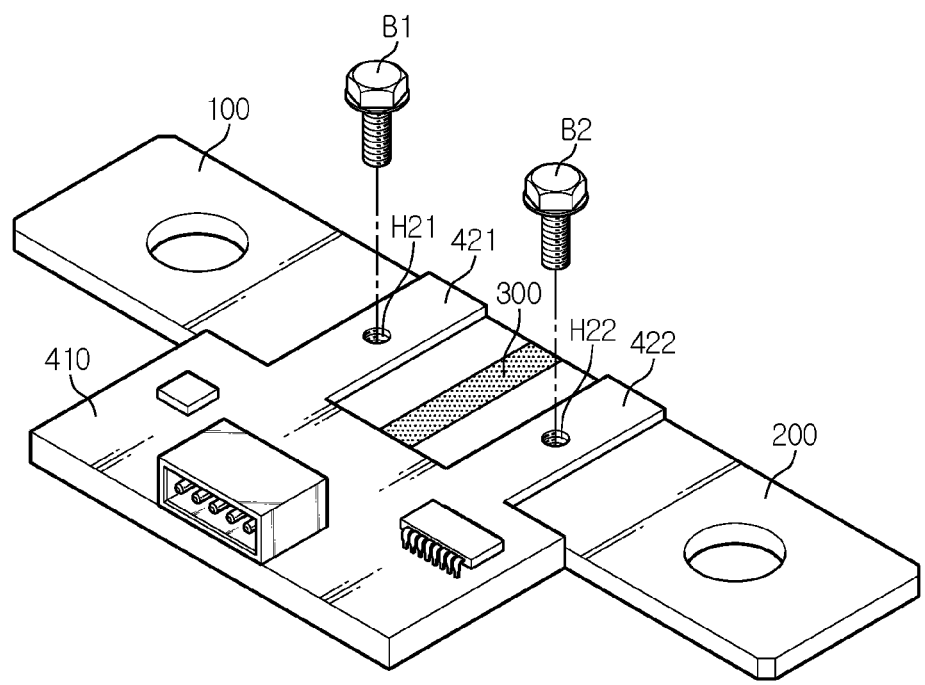
FIG. 14 is an exploded perspective view schematically showing a partial configuration of a current measurement apparatus according to still another embodiment of the present disclosure.

FIG. 14 is an exploded perspective view schematically showing a partial configuration of a current measurement apparatus according to still another embodiment of the present disclosure. In this embodiment, features different from the former embodiments will be described in detail.

Referring to FIG. 14, in the current measurement apparatus according to the present disclosure, the circuit board 400 may be coupled to the first terminal 100 and the second terminal 200 by a fastening member such as a bolt. More specifically, in the first extending portion 421 of the circuit board 400, a first coupling hole may be formed to be perforated in the vertical direction, as indicated by H21. In addition, a first perforation hole may also be formed in the first terminal 100 at a position and in a shape corresponding to the first coupling hole H21. In addition, in the second extending portion 422 of the circuit board 400, a second coupling hole may be formed to be perforated in the vertical direction, as indicated by H22. In addition, a second perforation hole may also be formed in the second terminal 200 at a position and in a shape corresponding to the second coupling hole H22.

In addition, the first bolt B1 may be inserted into the first coupling hole H21 and the first perforation hole to fasten the first extending portion 421 and the first terminal 100 with each other. In addition, the second bolt B2 may be inserted into the second coupling hole H22 and the second perforation hole to fasten the second extending portion 422 and the second terminal 200 with each other. Also, if the first bolt B1 and the second bolt B2 are separated from each hole, the circuit board 400 and each terminal may be separated from each other.

According to this configuration of the present disclosure, the resistor assembly and the circuit board 400 may be easily attached and detached. In particular, according to the present disclosure, when an abnormal situation such as overcurrent occurs, the resistor 300 may be cut by the cutting unit 600. In addition, if the resistor 300 is cut like this, the resistor assembly needs to be replaced with a new one. According to this embodiment, just by loosening the bolts B1, B2, the resistor assembly may be easily separated from the circuit board 400 and replaced with another new resistor assembly. Accordingly, the circuit board 400 and the like may be used continuously.

Moreover, although not shown in the drawings, in the above embodiment, the bolts B1, B2 may fasten not only the resistor assembly 100, 200, 300 and the circuit board 400 to each other, but also the cutting unit 600. For example, a fastening hole may also be formed in the cutting unit 600 at a position and in a shape corresponding to the first coupling hole H21 and the second coupling hole H22, and the bolts B1, B2 may also be inserted into these fastening hole. In this case, just by fastening one bolt, the resistor assembly 100, 200, 300, the circuit board 400, and the cutting unit 600 may be coupled and fixed at once.

In addition, in the above configuration, the circuit board 400 and the terminals 100, 200 may be electrically connected by the bolts B1, B2. That is, the first bolt B1 may be made of a conductor material and be configured to electrically connect the conductor pattern of the first extending portion 421 to the first terminal 100. In addition, the second bolt B2 may also be made of a conductor material and be configured to electrically connect the conductor pattern of the second extending portion 422 to the second terminal 200. According to this configuration of the present disclosure, the extending portions 421, 422 of the circuit board 400 and the terminals 100, 200 of the resistor assembly may be connected electrically and mechanically at once by fastening the bolts.

In another embodiment, the circuit board 400 and the terminal may be electrically connected by a ring terminal wire or the like. For example, one end of the ring terminal wire may be fastened to the first coupling hole H21 and the first fastening hole by the first bolt B1 to be mechanically and electrically connected to the first terminal 100, and the other end of the ring terminal wire may be mechanically and electrically connected to the body portion 410 of the circuit board 400 by another bolt or the like. In addition, one end and the other end of another ring terminal wire may be mechanically and electrically connected to the second coupling hole H22 and the second fastening hole and the body portion 410 of the circuit board 400, respectively.

In the current measurement apparatus according to the present disclosure, the cutting unit 600 may be configured to contain a gunpowder therein. In addition, the cutting unit 600 may be configured to explode the contained gunpowder and cut the resistor 300 by the explosion of the gunpowder. Also, the cutting unit 600 may explode the gunpowder based on a control signal of the control unit 500. To this end, the cutting unit 600 may be electrically connected to the control unit 500 to receive a control signal from the control unit 500. For example, the cutting unit 600 may be connected to the control unit 500 through an FPCB.

Figure 15:
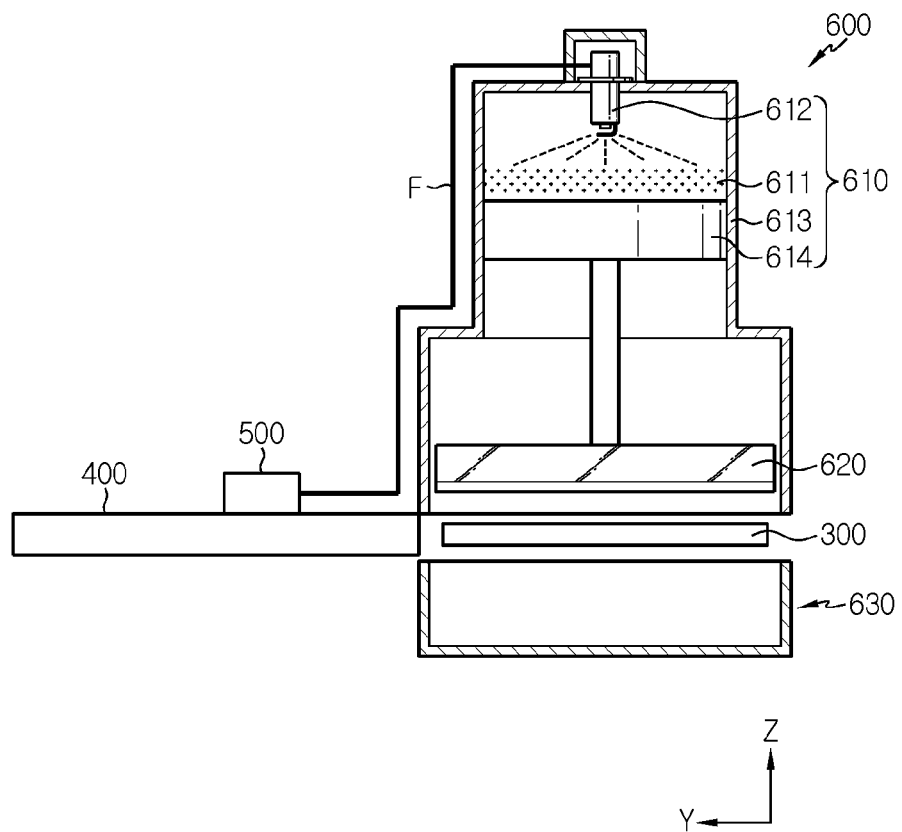
FIG. 15 is a side sectional view schematically showing a configuration of a current measurement apparatus according to still another embodiment of the present disclosure.

FIG. 15 is a side sectional view schematically showing a configuration of a current measurement apparatus according to still another embodiment of the present disclosure. In this embodiment, features different from the former embodiments will be described in detail. In particular, in FIG. 15, the cutting unit 600 is mainly illustrated, and other components are illustrated in a simplified form.

Referring to FIG. 15, in the current measurement apparatus according to the present disclosure, the cutting unit 600 may include an explosion portion 610, a pressing portion 620, and a cover portion 630.

Here, the explosion portion 610 may be located above or below the resistor 300, and may be configured to apply a cutting force due to the explosion to the resistor 300. More specifically, in FIG. 15, the explosion portion 610 is located above the resistor 300, and may include a gunpowder 611, an ignition switch 612, a cylinder 613, and a piston 614. Here, the ignition switch 612 may be connected to the control unit 500 through an electric connection element, as indicated by F in the drawing. Here, the electric connection element may be an FPCB, but other various types of connection elements may be used. Then, the ignition switch 612 may ignite a flame when a cutting signal is received from the control unit 500, so that the gunpowder 611 contained in the cylinder 613 explodes. In addition, due to the explosion of the gunpowder 611, the pressure inside the cylinder 613 increases, and the piston 614 may move downward quickly and strongly.

In addition, the pressing portion 620 may be connected to the piston 614. The pressing portion 620 may be configured to directly press the resistor 300 by receiving a force by the explosion force of the explosion portion 610. More specifically, if the piston 614 moves downward quickly and strongly, eventually, as indicated by an arrow in the drawing, the pressing portion 620 connected to the piston 614 also moves downward quickly and strongly. In addition, the movement of the pressing portion 620 may apply a pressure to the resistor 300 to cut the resistor 300 itself or disconnect the coupling between the resistor 300 and the first terminal 100 and/or between the resistor 300 and the second terminal 200. Therefore, a current may not flow through resistor assembly 100, 200, 300 any longer.

In addition, the cutting unit 600 may include a cover portion 630. The cover portion 630 may be located opposite to the pressing portion 620 based on the resistor 300. For example, in the configuration of FIG. 15, the pressing portion 620 may be located above the resistor 300, and the cover portion 630 may be located below the resistor 300. In addition, the cover portion 630 may be configured to prevent fragments of the resistor 300 cut by the pressing force of the pressing portion 620 from scattering. In particular, the cover portion 630 may have an empty space therein, and may be configured such that its side where the resistor 300 is located is open and all other sides are closed. For example, as in the configuration shown in FIG. 15, when the resistor 300 is located at an upper side, the cover portion 630 may be configured such that its upper portion is open and both lower and side portions are closed. According to this configuration of the present disclosure, when the resistor 300 is separated or damaged by the explosion portion 610 and the pressing portion 620, it is possible to prevent the separated or damaged resistor 300 or its fragments from scattering to the outside of the cutting unit 600. Accordingly, it is possible to prevent the configuration of the cutting unit 600 for cutting the resistor 300 from damaging other components of the current measurement apparatus.

Figure 16:
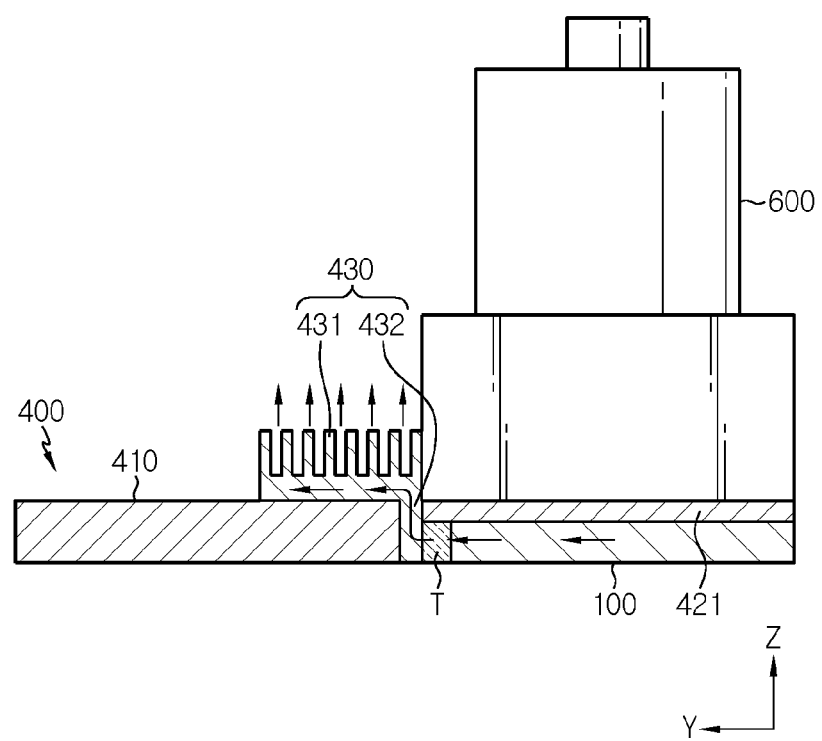
FIG. 16 is a side sectional view schematically showing a configuration of a current measurement apparatus according to still another embodiment of the present disclosure.

FIG. 16 is a side sectional view schematically showing a configuration of a current measurement apparatus according to still another embodiment of the present disclosure. In this embodiment, features different from the former embodiments will be described in detail.

Referring to FIG. 16, in the current measurement apparatus according to the present disclosure, the circuit board 400 may include a heat dissipation member 430. In particular, the heat dissipation member 430 may be mostly attached to the surface of the circuit board 400, for example the upper surface of the body portion 410. The heat dissipation member 430 may include a heat dissipation portion 431 for dissipating heat and a heat absorption portion 432 for absorbing heat. Moreover, the heat dissipation member 430 may be configured to absorb heat generated from the resistor assembly, particularly the first terminal 100 and the second terminal 200. To this end, the heat absorption portion 432 of the heat dissipation member 430 may be configured to directly or indirectly contact at least one of the first terminal 100, the resistor 300 and the second terminal 200 while maintaining electric insulation therewith. In addition, the heat absorbed from the resistor assembly through the heat absorption portion 432 in this way may be discharged to the outside through the heat dissipation portion 431, as indicated by arrows. The heat dissipation member 430 may be implemented in various types of heat dissipation configurations, such as a heatsink, known at the time of filing of this application.

In particular, a heat transfer material T may be interposed between the heat dissipation member 430 and at least one of the first terminal 100, the resistor 300 and the second terminal 200. For example, as shown in FIG. 16, a gel-like heat transfer material T may be interposed between the first terminal 100 and the heat absorption portion 432 of the heat dissipation member 430. In addition, although not shown in the drawing, a heat transfer material T may also be interposed between the resistor 300 and/or the second terminal 200 and the heat absorption portion 432 of the heat dissipation member 430. The heat transfer material T may be made of a material having high thermal conductivity and electric insulation. The heat transfer material T is widely known at the time of filing of this application and will not be described in detail here.

According to this configuration of the present disclosure, the heat of the resistor assembly, particularly the resistor 300, may be more smoothly discharged to the outside. In the case of the resistor 300, due to the temperature coefficient of resistance (TCR) characteristics, it is necessary to compensate in consideration of the effect of temperature when measuring current. However, by smoothly discharging the heat of the resistor 300 to the outside as in the embodiment, it is possible to reduce the effect of temperature, thereby improving the precision of resistance measurement and reducing the complexity of the calculation process.

Meanwhile, in the above embodiment, the heat absorption portion 432 may be configured to protrude downward below the heat dissipation portion 431 and to be coupled in contact with the inside of the body portion 410 of the circuit board 400. More specifically, one surface (the left surface in the drawing) of the heat absorption portion 432 may be in contact with the body portion 410, and the other surface (the right surface in the drawing) of the heat absorption portion 432 may be in contact with at least one of the first terminal 100, the resistor 300 and the second terminal 200. That is, the heat absorption portion 432 may be fixed in a state of being interposed between the body portion 410 and the resistor assembly 100, 200, 300, when viewed in the y-axis direction of FIG. 16. In addition, the heat absorption portion 432 may be interposed between the first extending portion 421 and the second extending portion 422, when viewed in the x-axis direction of FIG. 14.

According to this configuration of the present disclosure, the heat dissipation member 430 may be more stably fixed on the surface of the body portion 410. That is, in the heat dissipation member 430, movement of the heat absorption portion 432 in the left and right direction (x-axis direction in the drawing) may be restricted by the first extending portion 421 and the second extending portion 422, and movement of the heat absorption portion 432 in the front and rear direction (y-axis direction in the drawing) may be restricted by the body portion 410 and the resistor assembly.

The current measurement apparatus according to the present disclosure may be applied to a battery pack. Accordingly, the battery pack according to the present disclosure may include the current measurement apparatus described above. In addition, the battery pack according to the present disclosure further includes general components included in a battery pack, such as a battery cell, a pack case, a BMS, a charging and discharging bus bar, a voltage sensing assembly and the like, in addition to the current measurement apparatus.

In addition, the current measurement apparatus according to the present disclosure may be applied to a vehicle. Accordingly, the vehicle according to the present disclosure may include the current measurement apparatus described above. In addition, the vehicle according to the present disclosure may further include general components included in a vehicle, such as a vehicle body, a motor, a drive shaft and the like, in addition to the current measurement apparatus.

Meanwhile, although terms indicating directions such as "upper", "lower", "left", "right", "front" and "rear" have been used in this specification, it is obvious to those skilled in the art that these terms are only for convenience of explanation, and may be expressed differently depending on a viewing position of an observer or a location of an object.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

100: first terminal
200: second terminal
300: resistor
400: circuit board
401: measurement wire, 402: connector
410: body portion, 421: first extending portion, 422: second extending portion, 423: third extending portion
430: heat dissipation member
431: heat dissipation portion, 432: heat absorption portion
500: control unit
600: cutting unit
601: lower protrusion
610: explosion portion
611: gunpowder, 612: ignition switch, 613: cylinder, 614: piston
620: pressing portion
630: cover portion
700: case
701: lower case, 702: upper case
H1: terminal hole, B1: first bolt, B2: second bolt, H21: first coupling hole, H22: second coupling hole, F: electric connection element, T: heat transfer material

What is claimed is:

1. A current measurement apparatus, comprising:
an electrically conductive first terminal;
an electrically conductive second terminal spaced apart from the first terminal by a predetermined distance;
an electrically conductive resistor positioned in a space between the first terminal and the second terminal, wherein a material of the electrically conductive resistor has a greater specific resistance than materials of the first terminal and the second terminal;
a circuit board including an electric path, the circuit board positioned at a side portion of the first terminal and a side portion of the second terminal, and electrically connected to the first terminal and the second terminal, respectively; and
a control unit mounted on the circuit board and configured to measure a current flowing in the resistor based on a voltage value between the first terminal and the second terminal and a resistance value of the resistor,
wherein the control unit is configured to issue a control signal to cut the resistor based on the measured current,
wherein the circuit board includes a body portion positioned at the side portion of the first terminal and the side portion of the second terminal, a first extending portion extending in a horizontal direction from the body portion and positioned on a surface of the first terminal, and a second extending portion positioned on a surface of the second terminal.

2. The current measurement apparatus according to claim 1,
wherein each of the first terminal and the second terminal is a plate and is positioned on a same plane as the circuit board.

3. The current measurement apparatus according to claim 1,
further comprising gunpowder, an ignition switch, a cylinder, and a piston, wherein the cylinder is positioned at least partially above the surfaces of both the first extending portion and the second extending portion.

4. The current measurement apparatus according to claim 3,
wherein the cylinder comprises:
a main body positioned above the space between the first extending portion and the second extending portion; and
a lower protrusion extending outward from the main body in a horizontal direction and positioned at least partially above each of the first extending portion and the second extending portion.

5. The current measurement apparatus according to claim 1,
wherein the circuit board is configured to be removably attached to the first terminal and the second terminal.

6. The current measurement apparatus according to claim 1,
wherein the control signal causes the resistor to be cut by exploding the gunpowder.

7. The current measurement apparatus according to claim 6,
further comprising a press configured to press the resistor in response to explosion of the gunpowder, and a cover wherein the resistor is positioned between the press and the cover, and wherein the cover is configured to prevent scattering of the resistor when cut by the press.

8. The current measurement apparatus according to claim 1,
wherein the circuit board includes a heat dissipation member positioned on a surface of the circuit board, and a heat transfer material interposed between the heat dissipation member and at least one of the first terminal, the resistor or the second terminal.

9. A battery pack, comprising the current measurement apparatus according to claim 1.

10. A vehicle, comprising the current measurement apparatus according to claim 1.

* * * * *